(12) United States Patent
Tonegawa et al.

(10) Patent No.: US 12,060,640 B2
(45) Date of Patent: Aug. 13, 2024

(54) FILM FORMING METHOD AND SYSTEM

(71) Applicant: Tokyo Electron Limited, Tokyo (JP)

(72) Inventors: Yamato Tonegawa, Nirasaki (JP); Jinseok Kim, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/125,577

(22) Filed: Dec. 17, 2020

(65) Prior Publication Data
US 2021/0198787 A1   Jul. 1, 2021

(30) Foreign Application Priority Data

Dec. 26, 2019   (JP) .................................. 2019-236787

(51) Int. Cl.
| C23C 16/00 | (2006.01) |
| C23C 16/34 | (2006.01) |
| C23C 16/455 | (2006.01) |
| C23C 16/52 | (2006.01) |

(52) U.S. Cl.
CPC ...... *C23C 16/45536* (2013.01); *C23C 16/345* (2013.01); *C23C 16/45544* (2013.01); *C23C 16/52* (2013.01)

(58) Field of Classification Search
CPC .................................. H01L 21/00; C23C 16/00
See application file for complete search history.

(56) References Cited

U.S. PATENT DOCUMENTS

| 7,625,609 | B2 | 12/2009 | Matsuura |
| 10,388,511 | B2 | 8/2019 | Tonegawa |
| 2006/0216481 | A1 | 9/2006 | Suzuki |
| 2007/0082468 | A1* | 4/2007 | Blalock .................. C23C 16/34 438/584 |
| 2015/0275368 | A1 | 10/2015 | Motoyama et al. |
| 2016/0079054 | A1* | 3/2016 | Chen .................... C23C 16/045 438/762 |
| 2016/0148800 | A1* | 5/2016 | Henri ................. H01L 21/02592 438/503 |
| 2016/0365246 | A1* | 12/2016 | Yamamoto ........ H01L 21/02488 |
| 2019/0348271 | A1* | 11/2019 | Yan .................... C23C 16/45527 |
| 2020/0312654 | A1 | 10/2020 | Ito et al. |
| 2022/0013333 | A1 | 1/2022 | Tabuki et al. |

FOREIGN PATENT DOCUMENTS

| JP | 2006-278497 A | 10/2006 |
| JP | 2013-93551 A | 5/2013 |
| JP | 2018-11009 A | 1/2018 |
| JP | 2018-157035 A | 10/2018 |
| KR | 10-2013-0038137 A | 4/2013 |

\* cited by examiner

Primary Examiner — Kelly M Gambetta
Assistant Examiner — Mohammad Mayy
(74) Attorney, Agent, or Firm — Nath, Goldberg & Meyer; Jerald L. Meyer; Tanya E. Harkins

(57) ABSTRACT

A film forming method includes forming a thin film by executing a plurality of cycles each including supplying a raw material gas to a substrate, supplying a reaction gas capable of reacting with the raw material gas to the substrate, and processing the substrate with deuterium plasma.

8 Claims, 12 Drawing Sheets

FILM FORMING METHOD AND SYSTEM

CROSS-REFERENCE TO RELATED APPLICATION

This application is based upon and claims the benefit of priority from Japanese Patent Application No. 2019-236787, filed on Dec. 26, 2019, the entire contents of which are incorporated herein by reference.

TECHNICAL FIELD

The present disclosure relates to a film forming method and system.

BACKGROUND

A technique for forming a high-stress silicon nitride film at a low temperature by introducing hydrogen plasma during an atomic layer deposition (ALD) cycle is disclosed (see, e.g., Patent Document 1).

PRIOR ART DOCUMENT

Patent Document

Patent Document 1: Japanese Patent Application Publication No. 2006-278497

SUMMARY

According to one embodiment of the present disclosure, there is provided a film forming method including forming a thin film by executing a plurality of cycles each including supplying a raw material gas to a substrate, supplying a reaction gas capable of reacting with the raw material gas to the substrate, and processing the substrate with deuterium plasma.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
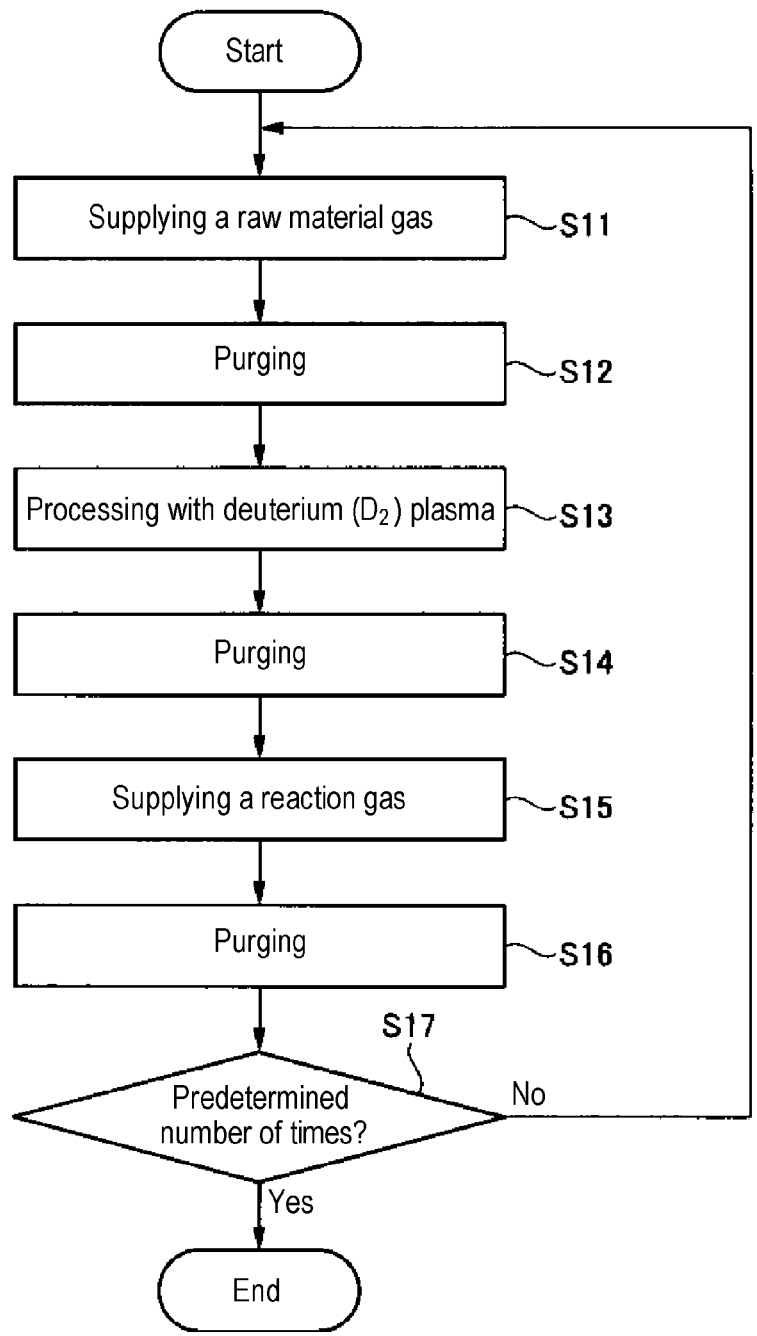
FIG. 1 is a flowchart showing a film forming method of a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. Throughout the attached drawings, the same or corresponding members or parts are designated by the same or corresponding reference numerals, and the duplicate description thereof is omitted.

[Film Forming Method]

The film forming method of one embodiment is a method of forming a thin film by atomic layer deposition (ALD), and includes a step of introducing deuterium ($D_2$) plasma during the ALD cycle. According to the film forming method of one embodiment, a thin film having a low impurity concentration can be formed. Hereinafter, a method for forming a silicon nitride film will be described as an example of the film forming method of one embodiment. However, the thin film formed by the film forming method of one embodiment is not limited to the silicon nitride film, and may be, for example, a silicon oxide film, a metal nitride film or a metal oxide film.

First Embodiment

FIG. 1 is a flowchart showing a film forming method of a first embodiment. In the present embodiment, the film forming method includes step S11 of supplying a raw material gas, step S12 of purging, step S13 of processing with deuterium plasma, step S14 of purging, step S15 of supplying a reaction gas, and a step S16 of purging. Furthermore, in the present embodiment, a plurality of cycles including steps S11 to S16 is executed. Moreover, in the present embodiment, step S13 of processing with the deuterium plasma is executed after step S11 of supplying the raw material gas and before step S15 of supplying the reaction gas. Hereinafter, the respective steps will be described.

In step S11 of supplying the raw material gas, the raw material gas is caused to be adsorbed to a substrate by supplying the raw material gas to the substrate accommodated in a processing container. In the present embodiment, the raw material gas may be a dichlorosilane (DCS) gas. However, the raw material gas is not limited thereto. For example, when forming a silicon nitride film or a silicon oxide film, various silicon raw material gases may be used as the raw material gas. Furthermore, for example, when forming a metal nitride film or a metal oxide film, various metal raw material gases may be used as the raw material gas.

Step S12 of purging is performed after step S11 of supplying the raw material gas. In step S12 of purging, the raw material gas remaining in the processing container is removed. In the present embodiment, step S12 of purging includes a step of supplying an inert gas such as a nitrogen ($N_2$) gas or an argon (Ar) gas into the processing container. Furthermore, step S12 of purging may include a step of evacuating the inside of the processing container without supplying a gas into the processing container.

Step S13 of processing with the deuterium plasma is performed after step S12 of purging. However, step S12 of purging may be omitted, and step S13 of processing with the deuterium plasma may be performed after step S11 of supplying the raw material gas. In step S13 of processing with the deuterium plasma, deuterium plasma is generated, and the substrate accommodated in the processing container is processed with the deuterium plasma. In the present embodiment, step S13 of processing with the deuterium plasma includes a step of turning a deuterium gas into deuterium plasma in the processing container and exposing the substrate to the deuterium plasma. At this time, an inert gas such as an $N_2$ gas or an Ar gas may be simultaneously supplied into the processing container.

Step S14 of purging is performed after step S13 of processing with the deuterium plasma. In step S14 of purging, the raw material gas and the deuterium gas remaining in the processing container are removed. In the present embodiment, step S14 of purging includes a step of supplying an inert gas such as an $N_2$ gas or an Ar gas into the processing container. Furthermore, step S14 of purging may include a step of evacuating the inside of the processing container without supplying a gas to the inside of the processing container.

Step S15 of supplying the reaction gas is performed after step S14 of purging. However, step S14 of purging may be omitted, and step S15 of supplying the reaction gas may be performed after step S13 of processing with the deuterium plasma. In the step S15 of supplying the reaction gas, a reaction gas is supplied to the substrate accommodated in the processing container to generate a reaction product of the raw material gas adsorbed to the substrate and the reaction gas. In the present embodiment, in step S15 of supplying the reaction gas, the raw material gas and the reaction gas are reacted by thermally decomposing the reaction gas or activating the reaction gas by plasma. Furthermore, in the present embodiment, the reaction gas may be an ammonia ($NH_3$) gas. However, the reaction gas is not limited thereto. For example, when forming a silicon nitride film or a metal nitride film, various nitriding gases may be used as the reaction gas. Furthermore, for example, when forming a silicon oxide film or a metal oxide film, various oxidizing gases may be used as the reaction gas.

Step S16 of purging is performed after step S15 of supplying the reaction gas. In step S16 of purging, the reaction gas remaining in the processing container is removed. In the present embodiment, step S16 of purging includes a step of supplying an inert gas such as an $N_2$ gas or an Ar gas into the processing container. Furthermore, step S16 of purging may include a step of evacuating the inside of the processing container without supplying a gas to the inside of the processing container.

Step S17 is performed after step S16 of purging. In step S17, it is determined whether or not the cycle including steps S11 to S16 has been performed a predetermined number of times. The predetermined number of times is predetermined according to the film thickness of a thin film to be formed. When the cycle including steps S11 to S16 reaches a predetermined number of times, the process ends. On the other hand, if the cycle including steps S11 to S16 has not reached a predetermined number of times, the process returns to step S11.

By performing steps S11 to S17, a silicon nitride film can be formed on the substrate.

According to the film forming method of the present embodiment, step S13 of processing with the deuterium plasma is performed after step S11 of supplying the raw material gas. As a result, impurities such as hydrogen (H) and chlorine (Cl) contained in the raw material gas adsorbed to the surface of the substrate can be desorbed by particles such as deuterium radicals or the like contained in the deuterium plasma. Therefore, it is possible to form a high-quality film having a low impurity concentration.

Furthermore, according to the film forming method of the present embodiment, step S13 of processing with the deuterium plasma is performed after step S11 of supplying the raw material gas. Therefore, a hydrogen (H) terminal in the film can be replaced by a deuterium (D) terminal formed by deuterium having a stronger bonding force than hydrogen. In addition, dangling bonds can be terminated with deuterium. Therefore, it is possible to prevent non-termination due to desorption occurring after film formation, for example, during a subsequent process. Moreover, since deuterium radicals have a longer life than hydrogen radicals, they can easily spread throughout the surface of the substrate. Therefore, the uniformity of a film quality in the plane of the substrate is improved.

Second Embodiment

Figure 2:
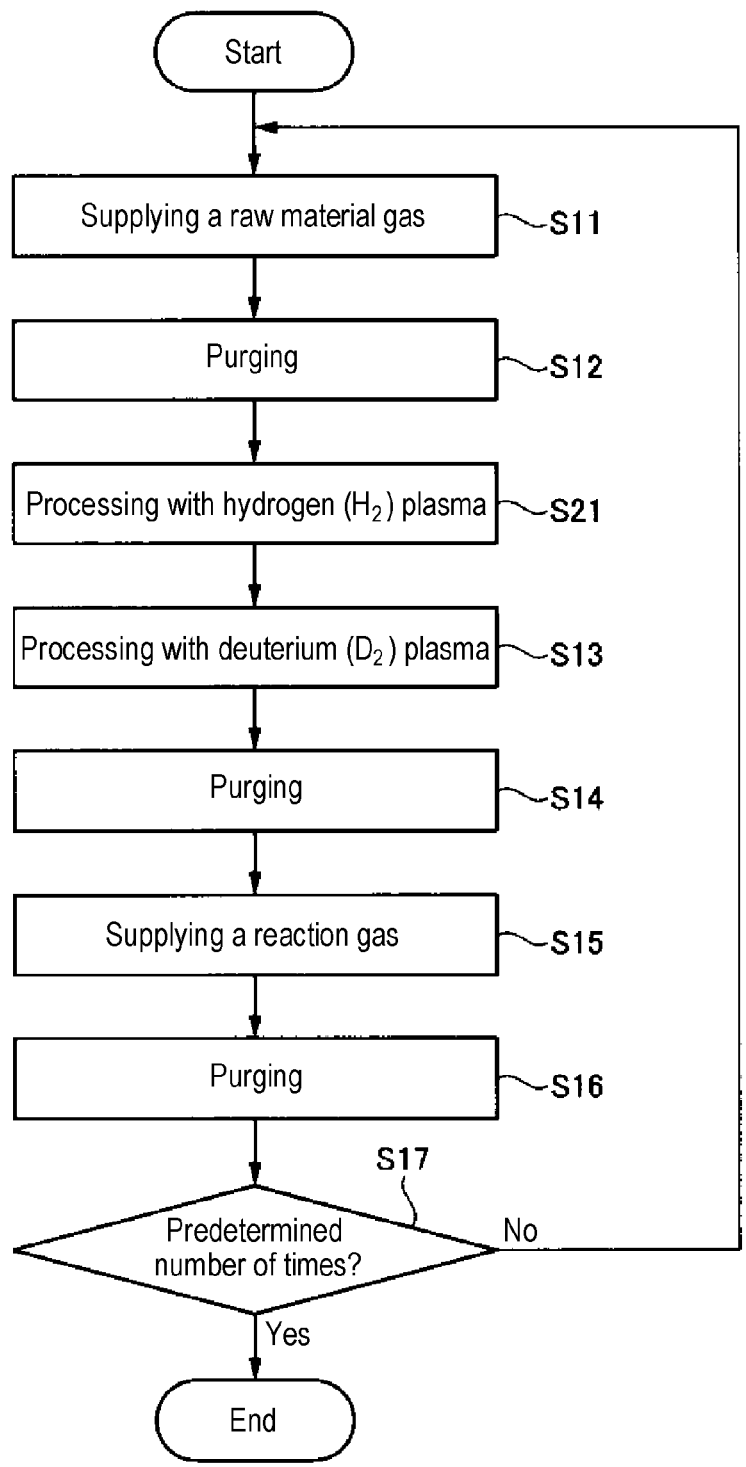
FIG. 2 is a flowchart showing a film forming method of a second embodiment.

FIG. 2 is a flowchart showing a film forming method of a second embodiment. The film forming method of the present embodiment differs from the film forming method of the first embodiment in that the film forming method of the second embodiment includes step S21 of processing with hydrogen plasma after step S11 of supplying the raw material gas and before step S13 of processing with the deuterium plasma. Other points are the same as those of the film forming method of the first embodiment. Hereinafter, the points different from those of the film forming method of the first embodiment will be mainly described.

Step S21 of processing with the hydrogen plasma is performed after step S12 of purging. However, step S12 of purging may be omitted, and step S21 of processing with the hydrogen plasma may be performed after step S11 of supplying the raw material gas. In step S21 of processing with the hydrogen plasma, hydrogen plasma is generated, and the substrate accommodated in the processing container is processed with the hydrogen plasma. In the present embodiment, step S21 of processing with the hydrogen plasma includes a step of turning a hydrogen gas into hydrogen plasma in the processing and exposing the substrate to the hydrogen plasma. At this time, an inert gas such as an $N_2$ gas or an Ar gas may be simultaneously supplied into the processing container. A step of purging may be performed after step S21 of processing with the hydrogen plasma and before step S13 of processing with the deuterium plasma.

According to the film forming method of the present embodiment, just like the film forming method of the first embodiment, step S13 of processing with the deuterium plasma is performed after step S11 of supplying the raw material gas. As a result, the same effects as those of the film forming method of the first embodiment are obtained.

Third Embodiment

Figure 3:
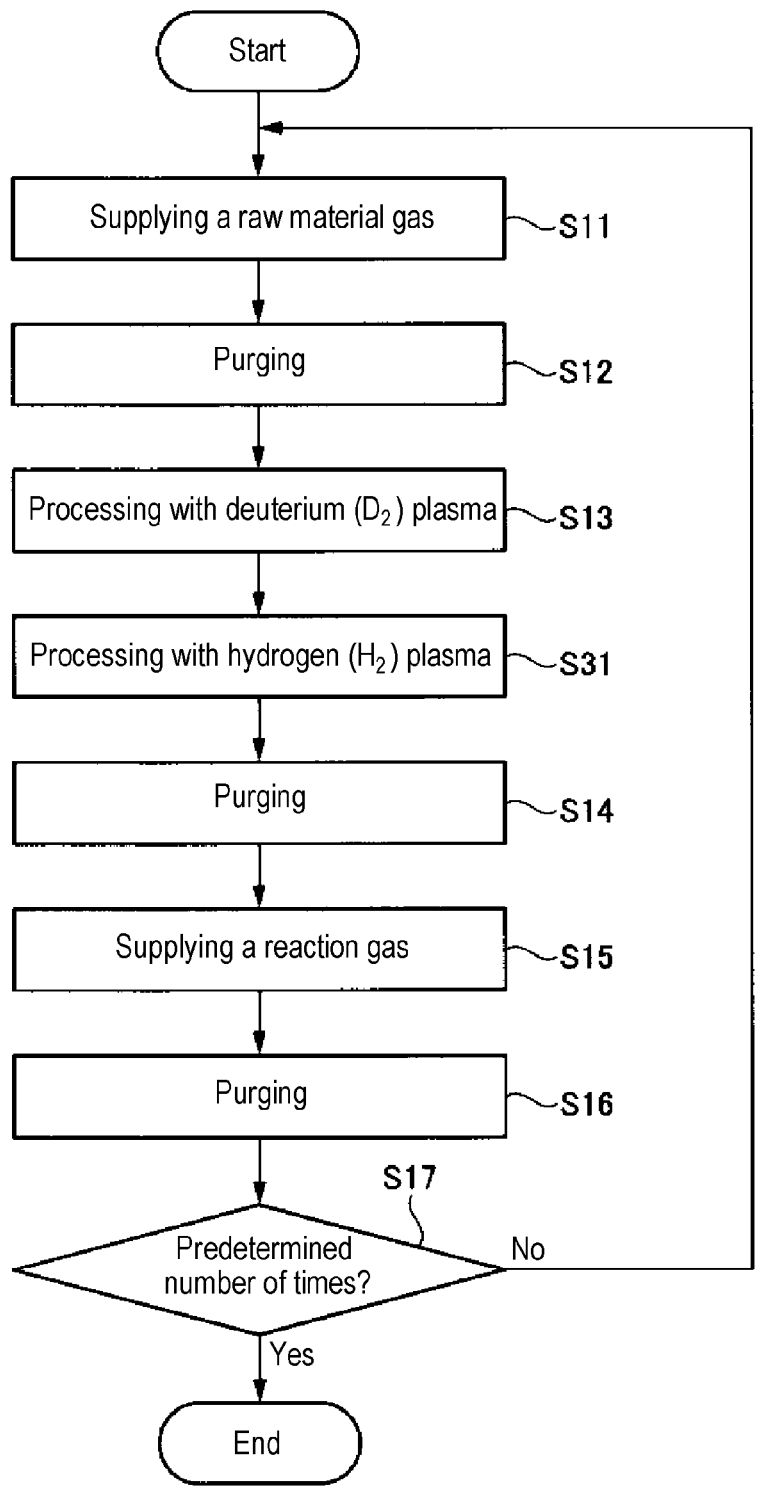
FIG. 3 is a flowchart showing a film forming method of a third embodiment.

FIG. 3 is a flowchart showing a film forming method of a third embodiment. The film forming method of the present embodiment differs from the film forming method of the first embodiment in that the film forming method of the third embodiment includes step S31 of processing with hydrogen plasma after step S13 of processing with the deuterium plasma and before step S15 of supplying the reaction gas. Other points are the same as those of the film forming method of the first embodiment. Hereinafter, the points different from those of the film forming method of the first embodiment will be mainly described.

Step S31 of processing with the hydrogen plasma is performed after step S13 of processing with the deuterium plasma. In step S31 of processing with the hydrogen plasma, hydrogen plasma is generated, and the substrate accommodated in the processing container is processed with the hydrogen plasma. In the present embodiment, step S31 of processing with the hydrogen plasma includes a step of turning a hydrogen gas into hydrogen plasma in the processing container and exposing the substrate to the hydrogen plasma. At this time, an inert gas such as an $N_2$ gas or an Ar gas may be simultaneously supplied into the processing container. A step of purging may be performed after step S13 of processing with the deuterium plasma and before step S31 of processing with the hydrogen plasma.

According to the film forming method of the present embodiment, just like the film forming method of the first embodiment, step S13 of processing with the deuterium plasma is performed after step S11 of supplying the raw material gas. As a result, the same effects as those of the film forming method of the first embodiment are obtained.

Fourth Embodiment

Figure 4:
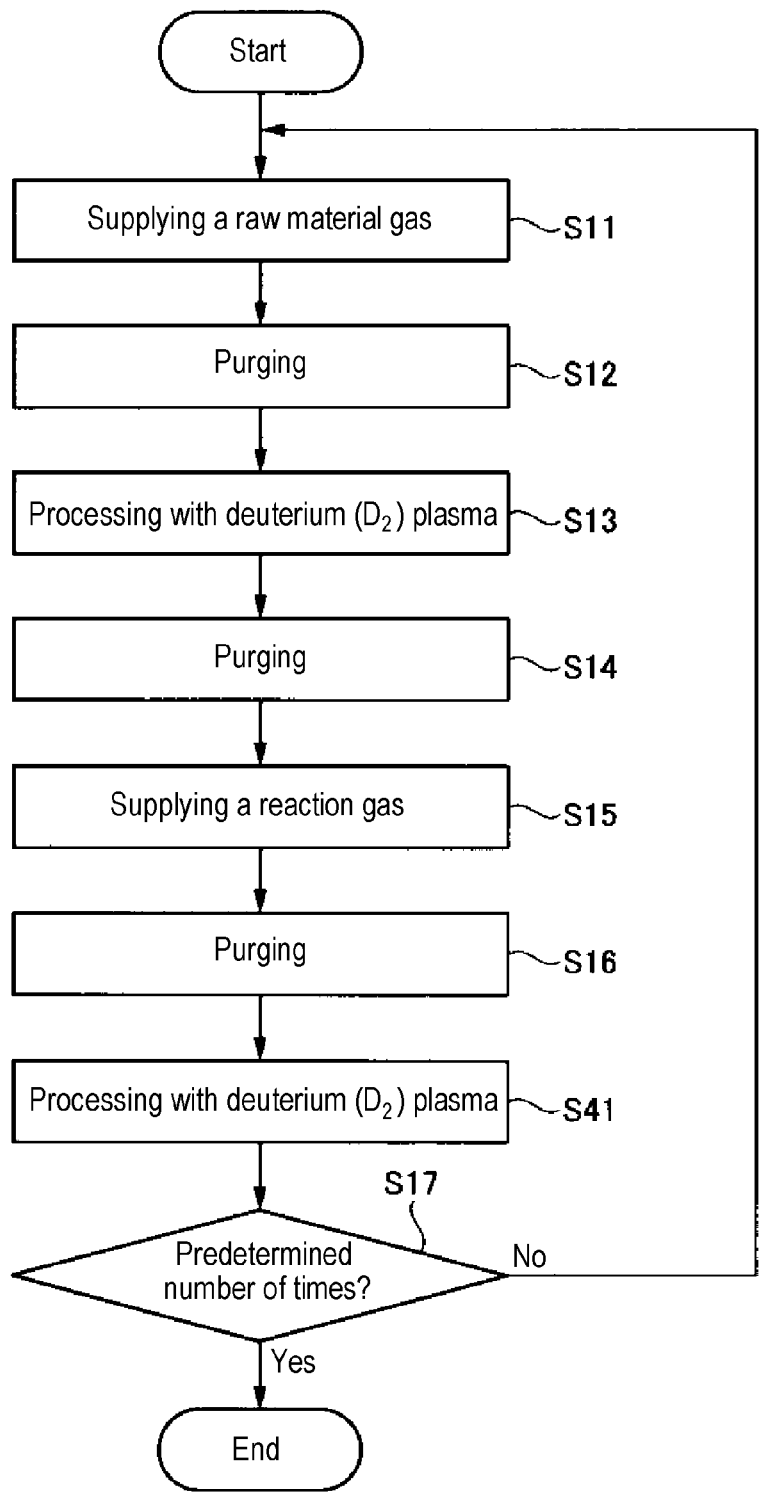
FIG. 4 is a flowchart showing a film forming method of a fourth embodiment.

FIG. 4 is a flowchart showing a film forming method of a fourth embodiment. The film forming method of the present embodiment differs from the film forming method of the first embodiment in that the film forming method of the fourth embodiment includes step S41 of processing with deuterium plasma after step S15 of supplying the reaction gas and before step S11 of supplying the raw material gas. Other points are the same those of the film forming method of the first embodiment. Hereinafter, the points different from those of the film forming method of the first embodiment will be mainly described.

Step S41 of processing with the deuterium plasma is performed after step S16 of purging. However, step S16 of purging may be omitted, and step S41 of processing with the deuterium plasma may be performed after step S15 of supplying the reaction gas. In step S41 of processing with the deuterium plasma, deuterium plasma is generated, and the substrate accommodated in the processing container is processed with the deuterium plasma. In the present embodiment, step S41 of processing with the deuterium plasma includes a step of turning a deuterium gas into deuterium plasma in the processing container and exposing the substrate to the deuterium plasma. At this time, an inert gas such as an $N_2$ gas or an Ar gas may be simultaneously supplied into the processing container. In the present embodiment, a purging is not performed after step S41 of processing with the deuterium plasma. However, the purging may be performed after step S41 of processing with the deuterium plasma.

According to the film forming method of the present embodiment, just like the film forming method of the first embodiment, step S13 of processing with the deuterium plasma is performed after step S11 of supplying the raw material gas. As a result, the same effects as those of the film forming method of the first embodiment are obtained.

Although the film forming methods of the first to fourth embodiments have been described above, two or more of the film forming methods of the first to fourth embodiments may be combined.

[Mechanism]

The mechanism in which a thin film having a low impurity concentration can be formed by the film forming methods of the above embodiments will be described.

First, the energy for activation of desorption of H bonded to Si from $SiNH_2ClH_2$ in the case of supplying H radicals (H*) and D radicals (D*) to $SiNH_2ClH_2$ was calculated by a B3LYP method as a generic function through the use of software Gaussian09. In addition, 6-311+g (2d, p) was used as a basis set.

Figure 5A:
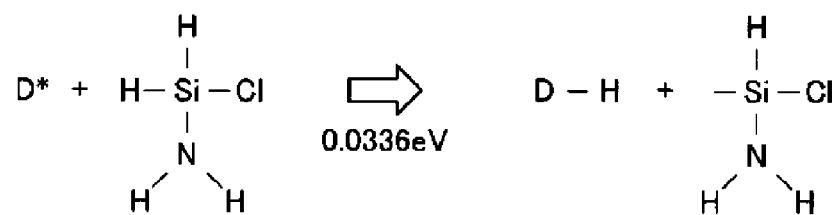
FIGS. 5A and 5B are diagrams showing the calculation results of the energy for activation of desorption of H.
Figure 5B:
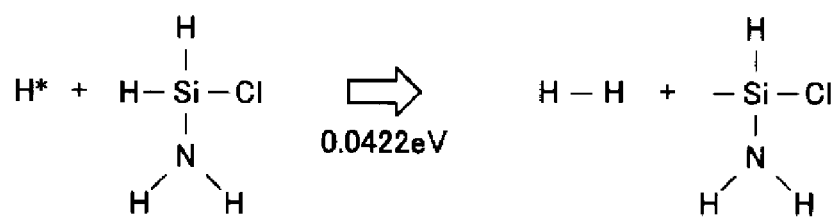

FIGS. 5A and 5B are diagrams showing the calculation results of the energy for activation of desorption of H. As shown in FIG. 5A, the energy for activation of desorption of H bonded to Si from $SiNH_2ClH_2$ in the case of supplying D radicals to $SiNH_2ClH_2$ was 0.0336 eV. Further, as shown in FIG. 5B, the energy for activation of desorption of H bonded to Si from $SiNH_2ClH_2$ in the case of supplying H radicals to $SiNH_2ClH_2$ was 0.0422 eV. From these results, it can be said that by supplying the D radicals to $SiNH_2ClH_2$, H bonded to Si can be desorbed with lower energy than when the H radicals are supplied.

Subsequently, the energy for activation of desorption of Cl bonded to Si from $SiNH_2ClH_2$ in the case of supplying H radicals and D radicals to $SiNH_2ClH_2$ was calculated by a B3LYP method as a generic function through the use of software Gaussian09. In addition, 6-311+g (2d, p) was used as a basis set.

Figure 6A:
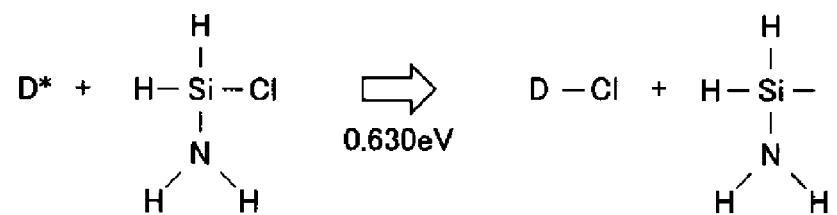
FIGS. 6A and 6B are diagrams showing the calculation results of the energy for activation of desorption of Cl.
Figure 6B:

FIGS. 6A and 6B are diagrams showing the calculation results of the energy for activation of desorption of Cl. As shown in FIG. 6A, the energy for activation of desorption of Cl bonded to Si from $SiNH_2ClH_2$ in the case of supplying D radicals to $SiNH_2ClH_2$ was 0.630 eV. Further, as shown in FIG. 6B, the energy for activation of desorption of Cl bonded to Si from $SiNH_2ClH_2$ in the case of supplying H radicals to $SiNH_2ClH_2$ was 0.653 eV. From these results, it can be said that by supplying the D radicals to $SiNH_2ClH_2$, Cl bonded to Si can be desorbed with lower energy than when the H radicals are supplied. Although the desorption of Cl is illustrated by way of example, the same effects can be expected for other halogen elements such as F, Br and I.

Next, the surface reaction that occurs on the surface of the silicon nitride film when the silicon nitride film is exposed to $D_2$ plasma and/or $H_2$ plasma will be described. FIGS. 7A to 7D are diagrams showing examples of the surface reaction when the silicon nitride film is exposed to the $D_2$ plasma and/or the $H_2$ plasma.

Figure 7A:
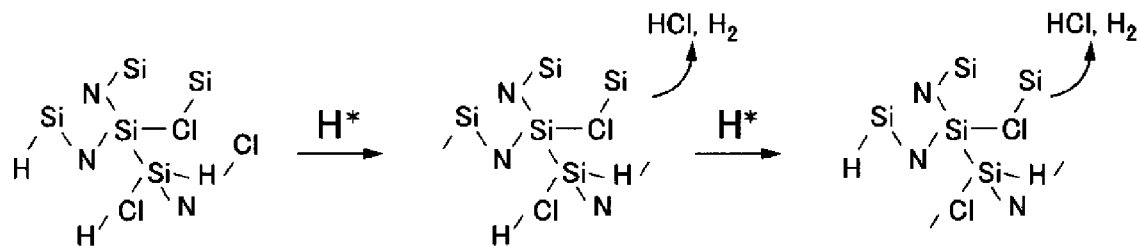
FIGS. 7A to 7D are diagrams showing examples of a surface reaction when a silicon nitride film is exposed to $D_2$ plasma and/or $H_2$ plasma.

FIG. 7A shows an example of the surface reaction that occurs when the silicon nitride film is exposed only to the $H_2$ plasma. As shown in FIG. 7A, when the silicon nitride film is exposed only to the $H_2$ plasma, H and Cl are extracted from the surface of the silicon nitride film by the H radicals contained in the $H_2$ plasma in the initial stage. At this time, H is hardly adsorbed to dangling bonds. In the later stage, H and Cl are further extracted from the surface of the silicon nitride film by the H radicals contained in the $H_2$ plasma. However, adsorption of H to dangling bonds may also occur.

Figure 7B:
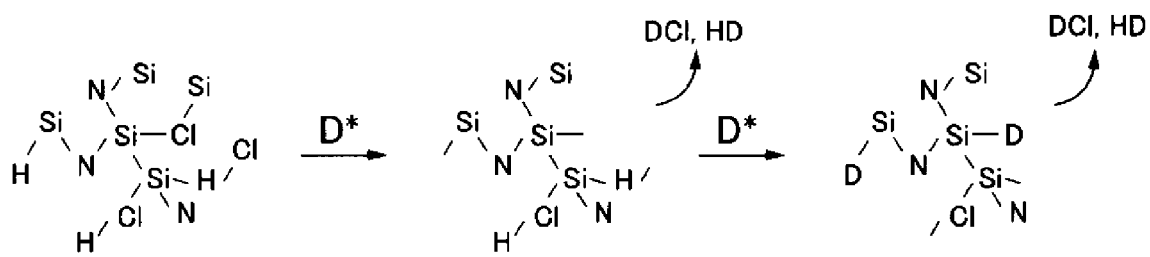

FIG. 7B shows an example of the surface reaction that occurs when the silicon nitride film is exposed only to the $D_2$ plasma. As shown in FIG. 7B, when the silicon nitride film is exposed only to the $D_2$ plasma, H and Cl are extracted from the surface of the silicon nitride film by the D radicals contained in the $D_2$ plasma in the initial stage. At this time, the energy for activation of desorption of H and Cl from $SiNH_2ClH_2$ by the D radicals is smaller than the energy for activation of desorption of H and Cl from $SiNH_2ClH_2$ by the H radicals. Therefore, when the silicon nitride film is exposed to the $D_2$ plasma, H and Cl are extracted from the surface of the silicon nitride film in a larger amount than when the silicon nitride film is exposed to the $H_2$ plasma. In addition, D is hardly adsorbed to dangling bonds. In the later stage, H and Cl are further extracted from the surface of the silicon nitride film by the D radicals contained in the $D_2$ plasma. Further, adsorption of D to dangling bonds may also occur. In this way, by exposing the silicon nitride film to the $D_2$ plasma alone, H and Cl can be removed in a larger amount than when exposing the silicon nitride film to the $H_2$ plasma alone.

Figure 7C:
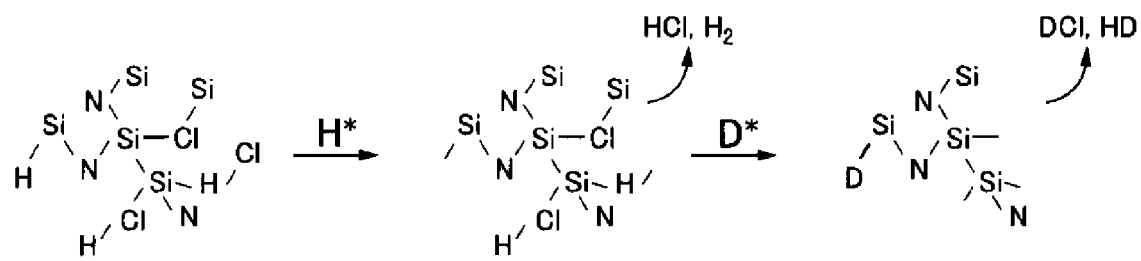

FIG. 7C shows an example of the surface reaction that occurs when the silicon nitride film is exposed to the $H_2$ plasma and subsequently exposed to the $D_2$ plasma. As shown in FIG. 7C, when the silicon nitride film is exposed to the $H_2$ plasma and subsequently exposed to the $D_2$ plasma, in the initial stage, H and Cl are extracted from the surface of the silicon nitride film by the H radicals contained in the $H_2$ plasma. At this time, H is hardly adsorbed to dangling bonds. In the later stage, H and Cl are extracted from the surface of the silicon nitride film by the D radicals contained in the $D_2$ plasma. At this time, the energy for activation of desorption of H and Cl from $SiNH_2ClH_2$ by the D radicals is smaller than the energy for activation of desorption of H and Cl from $SiNH_2ClH_2$ by the H radicals. Therefore, when the silicon nitride film is exposed to the $D_2$ plasma, H and Cl are extracted from the surface of the silicon nitride film in a larger amount than when the silicon nitride film is exposed to the $H_2$ plasma. Further, in the later stage, adsorption of D to dangling bonds may occur. However, the amount of H and Cl desorbed is smaller than that when the silicon nitride film is exposed to the $D_2$ plasma in the initial stage (the dangling bonds are few). Therefore, the amount of D adsorbed is smaller than that when the silicon nitride film is exposed only to the $D_2$ plasma. As a result, it is possible to form a silicon nitride film having a particularly low concentration of impurities such as H, D and Cl.

Figure 7D:
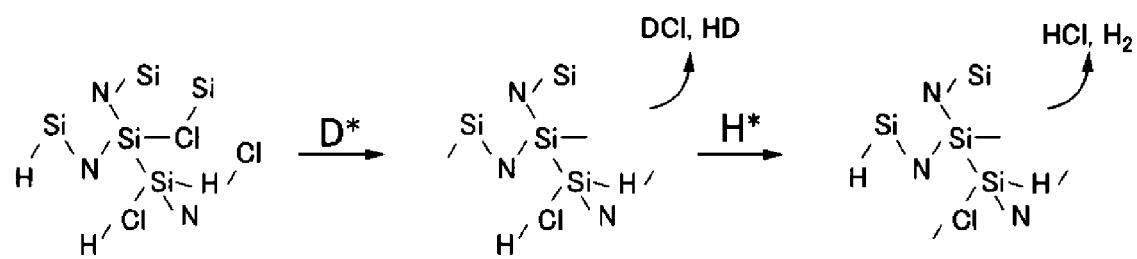

FIG. 7D shows an example of the surface reaction that occurs when the silicon nitride film is exposed to the $D_2$ plasma and subsequently to the $H_2$ plasma. As shown in FIG. 7D, in a case where the silicon nitride film is exposed to the $D_2$ plasma and subsequently to the $H_2$ plasma, when the silicon nitride film is exposed to the $D_2$ plasma in the initial stage, H and Cl are extracted from the surface of the silicon nitride film by the D radicals contained in the $D_2$ plasma. At this time, the energy for activation of desorption of H and Cl from $SiNH_2ClH_2$ by the D radicals is smaller than the energy for activation of desorption of H and Cl from $SiNH_2ClH_2$ by the H radicals. Therefore, when the silicon nitride film is exposed to the $D_2$ plasma, H and Cl are extracted from the surface of the silicon nitride film in a larger amount than when the silicon nitride film is exposed to the $H_2$ plasma. In addition, D is hardly adsorbed to dangling bonds. In the later stage, H and Cl are further extracted from the surface of the silicon nitride film by the H radicals contained in the $H_2$ plasma. Further, adsorption of H to dangling bonds may also occur. Thus, by exposing the silicon nitride film to the $D_2$ plasma and subsequently to the $H_2$ plasma, H and Cl can be removed in a larger amount than when the silicon nitride film is exposed only to the $H_2$ plasma.

[Film Forming Apparatus]

The film forming apparatus capable of carrying out the above film forming methods will be described by taking as an example a batch type vertical thermal processing apparatus that collectively performs a thermal processing on a large number of substrates. However, the film forming apparatus is not limited to the batch type apparatus, and may be, for example, a single-substrate type apparatus that processes substrates one by one. Further, the film forming apparatus may be a semi-batch type apparatus. In the semi-batch type apparatus, a plurality of substrates arranged around a rotation axis of a rotary table is rotated together with the rotary table so as to sequentially pass through a plurality of regions to which different gases are supplied.

Figure 8:
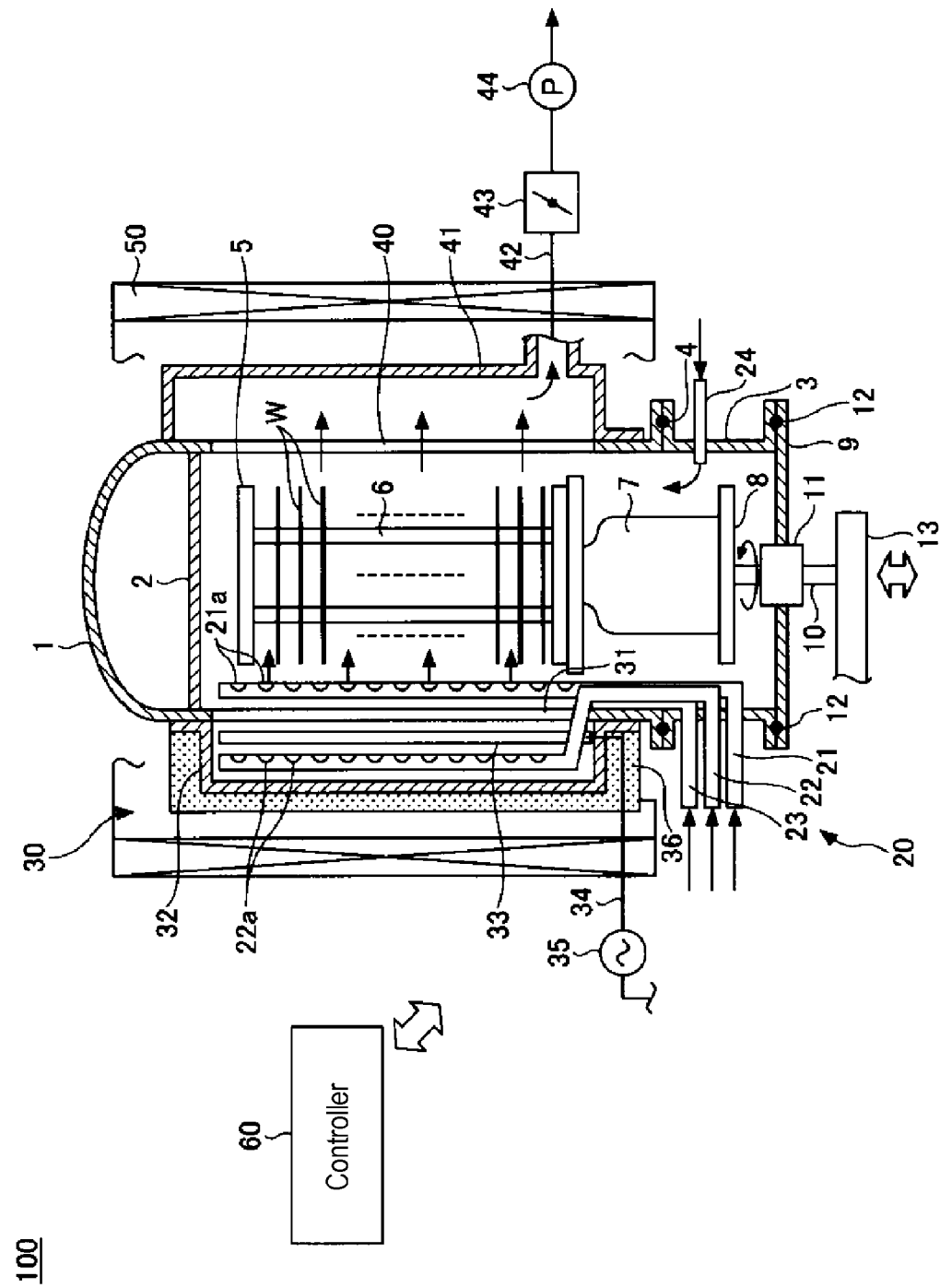
FIG. 8 is a sectional view showing an example of a film forming apparatus capable of carrying out the film forming methods of the first to fourth embodiments.
Figure 9:
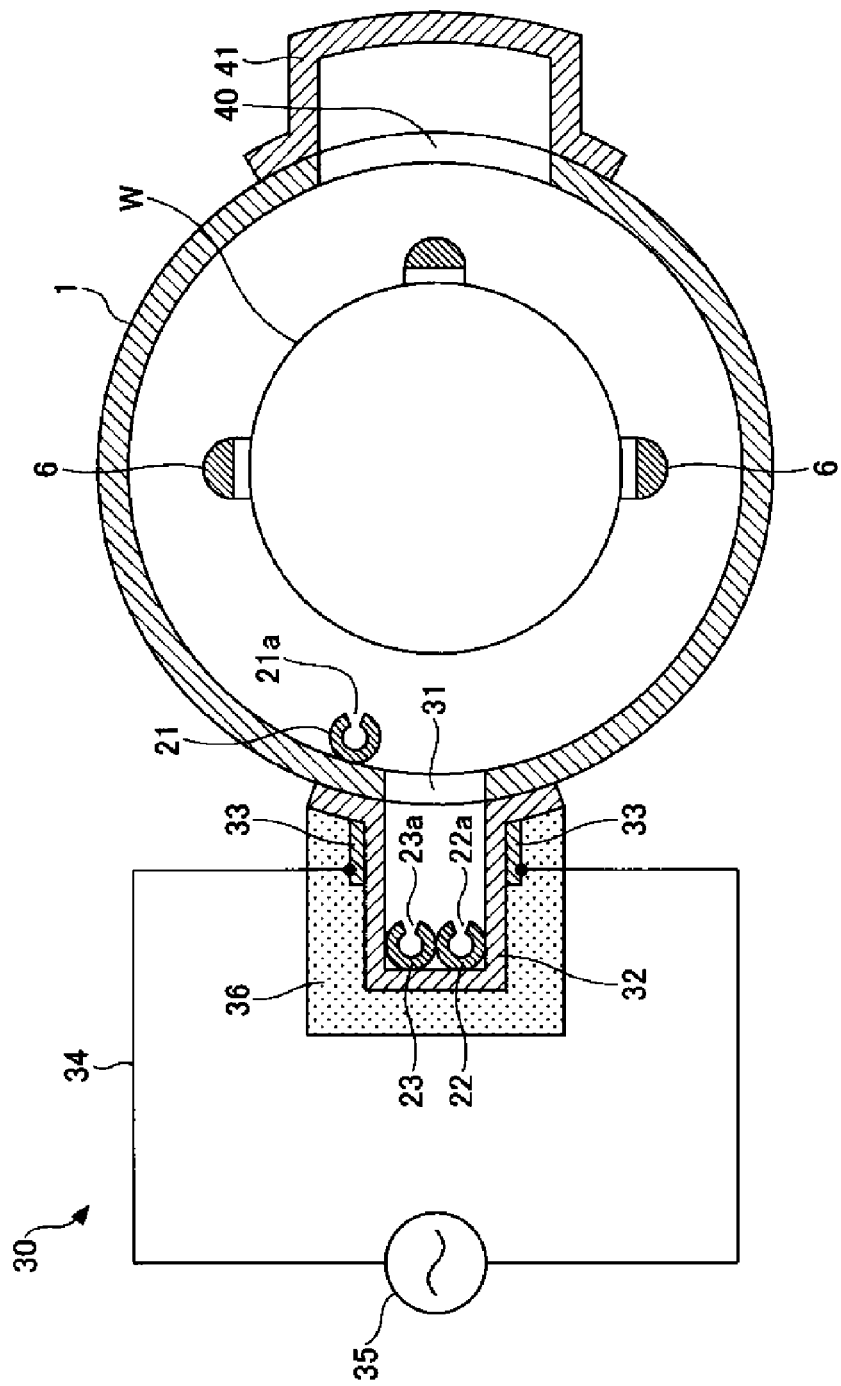
FIG. 9 is a view used to explain a processing container of the film forming apparatus shown in FIG. 8.

FIG. 8 is a sectional view showing an example of the film forming apparatus capable of carrying out the film forming methods of the first to fourth embodiments. FIG. 9 is a view used to explain a processing container of the film forming apparatus shown in FIG. 8.

The vertical thermal processing apparatus 100 includes a cylindrical processing container 1 having a ceiling and an open lower end. The entire processing container 1 is made of, for example, quartz. A ceiling plate 2 made of quartz is provided near the upper end of the processing container 1, and a region below the ceiling plate 2 is sealed. A metal-made manifold 3 formed into a cylindrical body shape is connected to the lower end opening of the processing container 1 via a sealing member 4 such as an O-ring or the like.

The manifold 3 supports the lower end of the processing container 1. A wafer boat 5 on which a large number of (e.g., 25 to 150) semiconductor wafers (hereinafter referred to as "wafers W") as substrates are mounted in multiple stages is inserted into the processing container 1 from below the manifold 3. In this way, a large number of wafers W are accommodated substantially horizontally in the processing container 1 at intervals along the vertical direction. The wafer boat 5 is made of, for example, quartz. The wafer boat 5 has three rods 6 (see FIG. 2). A large number of wafers W are supported by grooves (not shown) formed in the rods 6.

The wafer boat 5 is placed on a table 8 via a heat insulating cylinder 7 made of quartz. The table 8 is supported on a rotation shaft 10 penetrating a metal (stainless steel) lid 9 that opens and closes the lower end opening of the manifold 3.

A magnetic fluid seal 11 is provided at the penetration portion of the rotation shaft 10 to hermetically seal and rotatably support the rotation shaft 10. A sealing member 12 for maintaining airtightness in the processing container 1 is provided between the peripheral portion of the lid 9 and the lower end of the manifold 3.

The rotation shaft 10 is attached to the tip of an arm 13 supported by an elevating mechanism (not shown) such as a boat elevator or the like. The wafer boat 5 and the lid 9 are integrally moved up and down, and are inserted into and removed from the processing container 1. The table 8 may be fixedly provided on the side of the lid 9 so that the wafers W can be processed without rotating the wafer boat 5.

Furthermore, the vertical thermal processing apparatus 100 includes a gas supply part 20 that supplies a gas such as a processing gas or a purge gas into the processing container 1.

The gas supply part 20 includes gas supply pipes 21, 22, 23 and 24. The gas supply pipes 21, 22 and 23 are made of, for example, quartz, and are configured to extend inward through the side wall of the manifold 3 and extend vertically after being bent upward. A plurality of gas holes 21a, 22a and 23a is formed at predetermined intervals in the vertical portions of the gas supply pipes 21, 22 and 23, respectively, over a length in the vertical direction corresponding to the wafer support range of the wafer boat 5. The gas holes 21a, 22a and 23a are configured to discharge gases in the horizontal direction. The gas supply pipe 24 is made of, for example, quartz, and is composed of a short quartz pipe provided so as to penetrate the side wall of the manifold 3.

The vertical portion of the gas supply pipe 21 is provided in the processing container 1. A gas containing a film-forming raw material (hereinafter referred to as "raw material gas") is supplied to the gas supply pipe 21 from a raw material gas supply source via a gas pipeline. A flow rate controller and an opening/closing valve are provided in the gas pipeline. As a result, the raw material gas from the raw material gas supply source is supplied into the processing container 1 via the gas pipeline and the gas supply pipe 21. As the raw material gas, it may be possible to use, for example, silicon (Si) compounds containing Cl, such as dichlorosilane (DCS; $SiH_2Cl_2$), monochlorosilane (MCS; $SiH_3Cl$), trichlorosilane (TCS; $SiHCl_3$), silicon tetrachloride (STC; $SiCl_4$), hexachlorodisilane (HCD; $Si_2Cl_6$) and the like. Furthermore, as the raw material gas, it may be possible to use, for example, silicon (Si) compounds containing iodine (I), such as diiodosilane (DIS; $SiH_2I_2$), triiodosilane (TIS; $SiHI_3$) and the like, or, for example, silicon (Si) compounds containing bromine (Br), such as dibromosilane (DBS; $SiH_2Br_2$), tribromosilane (TBS; $SiHBr_3$) and the like.

The vertical portion of the gas supply pipe 22 is provided in a plasma generation space described later. A nitriding gas is supplied to the gas supply pipe 22 from a nitriding gas supply source via a gas pipeline. A flow rate controller and an opening/closing valve are provided in the gas pipeline. As a result, the nitriding gas from the nitride gas supply source is supplied to the plasma generation space via the gas pipeline and the gas supply pipe 22, converted into plasma in the plasma generation space, and supplied into the processing container 1. As the nitriding gas, it may be possible to use, for example, ammonia ($NH_3$), nitrogen ($N_2$), diazene ($N_2H_2$), or organic hydrazine compounds such as hydrazine ($N_2H_4$), monomethylhydrazine ($CH_3(NH)NH_2$) and the like.

The vertical portion of the gas supply pipe 23 is provided in the plasma generation space described later. A hydrogen ($H_2$) gas is supplied to the gas supply pipe 23 from a hydrogen gas supply source via a gas pipeline. Further, a deuterium ($D_2$) gas is supplied to the gas supply pipe 23 from a deuterium gas supply source via a gas pipeline. A flow rate controller and an opening/closing valve are provided in the gas pipeline. As a result, the $H_2$ gas from the hydrogen gas supply source and the $D_2$ gas from the deuterium gas supply source are supplied to the plasma generation space via the gas pipe and the gas supply pipe 23, converted into plasma in the plasma generation space, and supplied into the processing container 1.

A purge gas is supplied to the gas supply pipe 24 from a purge gas supply source via a gas pipeline. A flow rate controller and an opening/closing valve are provided in the gas pipeline. As a result, the purge gas from the purge gas supply source is supplied into the processing container 1 via the gas pipeline and the gas supply pipe 24. As the purge gas, it may be possible to use, for example, an inert gas such as argon (Ar) or nitrogen ($N_2$). Although there has been described the case where the purge gas is supplied from the purge gas supply source to the processing container 1 via the gas pipeline and the gas supply pipe 24, the present disclosure is not limited thereto. The purge gas may be supplied from the gas supply pipes 21, 22 and 23.

A plasma generation mechanism 30 is formed on a part of the side wall of the processing container 1. The plasma generation mechanism 30 turns a nitriding gas into plasma to generate an active species for nitriding. Further, the plasma generation mechanism 30 turns an $H_2$ gas into plasma to generate H radicals. In addition, the plasma generation mechanism 30 turns a $D_2$ gas into plasma to generate D radicals.

The plasma generation mechanism 30 includes a plasma partition wall 32, a pair of plasma electrodes 33, a power feeding line 34, a high frequency power supply 35 and an insulating protection cover 36.

The plasma partition wall 32 is airtightly welded to the outer wall of the processing container 1. The plasma partition wall 32 is made of, for example, quartz. The plasma partition wall 32 has a concave cross section and covers an opening 31 formed in the side wall of the processing container 1. The opening 31 is formed to be elongated in the vertical direction so as to cover all the wafers W supported by the wafer boat 5 in the vertical direction. In the inner space, i.e., the plasma generation space, which is defined by the plasma partition wall 32 and communicating with the inside of the processing container 1, there are arranged the gas supply pipe 22 for discharging the nitriding gas and the gas supply pipe 23 for discharging the $H_2$ gas and the $D_2$ gas. The gas supply pipe 21 for discharging the raw material gas is provided at a position close to the wafers W along the inner wall of the processing container 1 outside the plasma generation space.

The plasma electrodes 33 have an elongated shape, and are arranged on the outer surfaces of the both side walls of the plasma partition wall 32 so as to face each other and extend in the vertical direction. The power feeding line 34 is connected to the lower end of each of the plasma electrodes 33.

The power feeding line 34 electrically connects each plasma electrode 33 and the high frequency power supply 35. In the illustrated example, one end of the feeding line 34 is connected to the lower end, which is a side portion of the short side of each plasma electrode 33, and the other end is connected to the high frequency power supply 35.

The high frequency power supply 35 is connected to the lower end of each of the plasma electrodes 33 via the power feeding line 34 to supply high-frequency power of, for example, 13.56 MHz to the plasma electrodes 33. As a result, the high-frequency power is applied to the plasma generation space defined by the plasma partition wall 32. The nitriding gas discharged from the gas supply pipe 22 is turned into plasma in the plasma generation space to which the high-frequency power is applied. The active species for nitriding thus generated is supplied into the processing container 1 through the opening 31. Further, the $H_2$ gas and $D_2$ gas discharged from the gas supply pipe 23 are turned into plasma in the plasma generation space to which the high-frequency power is applied. The H radicals and the D radicals thus generated are supplied into the processing container 1 via the opening 31.

The insulating protection cover 36 is attached to the outside of the plasma partition wall 32 so as to cover the plasma partition wall 32. A coolant passage (not shown) is provided in the inner portion of the insulating protection cover 36. The plasma electrode 33 is cooled by allowing a coolant such as a cooled nitrogen ($N_2$) gas or the like to flow through the coolant passage. Further, a shield (not shown) may be provided between the plasma electrodes 33 and the insulating protection cover 36 so as to cover the plasma electrodes 33. The shield is formed of a good conductor such as metal or the like and is grounded.

An exhaust port 40 for evacuating the inside of the processing container 1 is provided on the side wall portion of the processing container 1 facing the opening 31. The exhaust port 40 is vertically elongated so as to correspond to the wafer boat 5. An exhaust port cover member 41 having a U-shaped cross section is attached to a portion of the processing container 1 corresponding to the exhaust port 40 so as to cover the exhaust port 40. The exhaust port cover member 41 extends upward along the side wall of the processing container 1. An exhaust pipe 42 for evacuating the processing container 1 via the exhaust port 40 is connected to the lower part of the exhaust port cover member 41. An exhaust device 44 including a pressure control valve 43 for controlling the pressure in the processing container 1 and a vacuum pump is connected to the exhaust pipe 42. The inside of the processing container 1 is evacuated by the exhaust device 44 via the exhaust pipe 42.

Furthermore, a cylindrical heating mechanism 50 for heating the processing container 1 and the wafer W inside the processing container 1 is provided so as to surround the outer periphery of the processing container 1.

Furthermore, the vertical thermal processing apparatus 100 includes a controller 60. The controller 60 controls, for example, the operation of each part of the vertical thermal processing apparatus 100. The controller 60 may be, for example, a computer or the like. Further, a computer program for operating each part of the vertical thermal processing apparatus 100 is stored in a storage medium. The storage medium may be a non-transitory storage medium, for example, a flexible disk, a compact disk, a hard disk, a flash memory, a DVD or the like.

An example of a method of forming a thin film on a wafer W by the film forming method of one embodiment through the use of the vertical thermal processing apparatus 100 will be described.

First, the controller 60 controls the elevating mechanism (not shown) to load the wafer boat 5 holding a large number of wafers W into the processing container 1, and the lower end operation of the processing container 1 is airtightly closed by the lid 9.

Subsequently, the controller 60 controls the gas supply part 20, the plasma generation mechanism 30, the pressure control valve 43, the heating mechanism 50 and the like so as to execute any of the film forming methods of the first to fourth embodiments described above. As a result, a silicon nitride film having a low impurity concentration can be formed on the wafer W.

[Simulation Result]

Using the software ANSYS Chemkin-Pro 2019 R2, the mole fraction of each particle contained in the $H_2$ plasma and the $D_2$ plasma was calculated by the Plasma PSR (Perfectly Stirred Reactor) model.

First, the mole fraction of each particle contained in the $H_2$ plasma and the $D_2$ plasma was calculated using the simulation condition A shown below.

Figure 10:
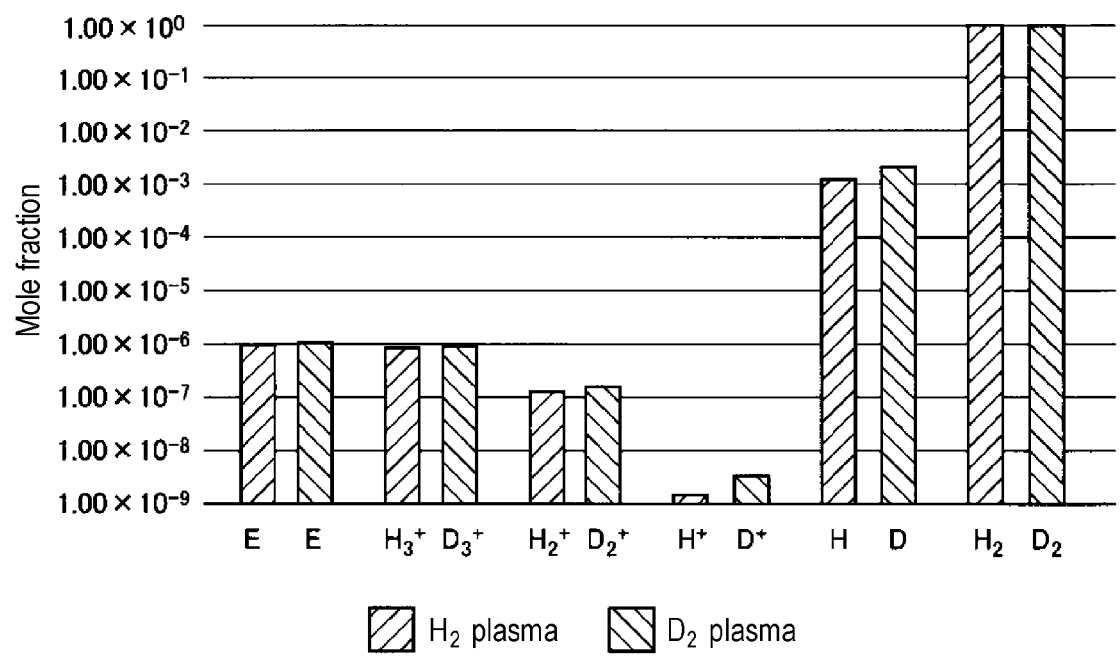
FIG. 10 is a diagram showing the calculation results of a mole fraction of each particle contained in $H_2$ plasma and $D_2$ plasma, which are obtained by simulation.

(Simulation Condition A)
  Volume of plasma generation space: $1.008 \times 10^{-5}$ m$^3$
  Pressure in plasma generation space: 300 mTorr (40 Pa)
  Gas temperature during plasma processing: 550 degrees C.
  Gas flow rate per plasma generation space: 50.85 sccm
  Plasma power per plasma generation space: 0.8474 W FIG. 10 is a diagram showing the calculation results of the mole fraction of each particle contained in the $H_2$ plasma and the $D_2$ plasma, which are obtained by simulation. In FIG. 10, the calculation results of the mole fractions of electrons (E), protonated molecules ($H_3^+$, $D_3^+$), molecular ions ($H_2^+$, $D_2^+$), ions ($H^+$, $D^+$), radicals (H, D) and molecules ($H_2$, $D_2$) are shown sequentially from the left side.

As shown in FIG. 10, it was confirmed that the amount of D radicals contained in the $D_2$ plasma is about 1.7 times larger than the amount of H radicals contained in the $H_2$ plasma. From the results, it is considered that the modification effect of the film formed by the ALD cycle can be improved by introducing the $D_2$ plasma during the ALD cycle.

Next, the ratio of D radicals to H radicals (D/H) when the gas temperature is changed over a range of 300 to 700 degrees C. was evaluated with respect to the simulation condition A.

Figure 11:
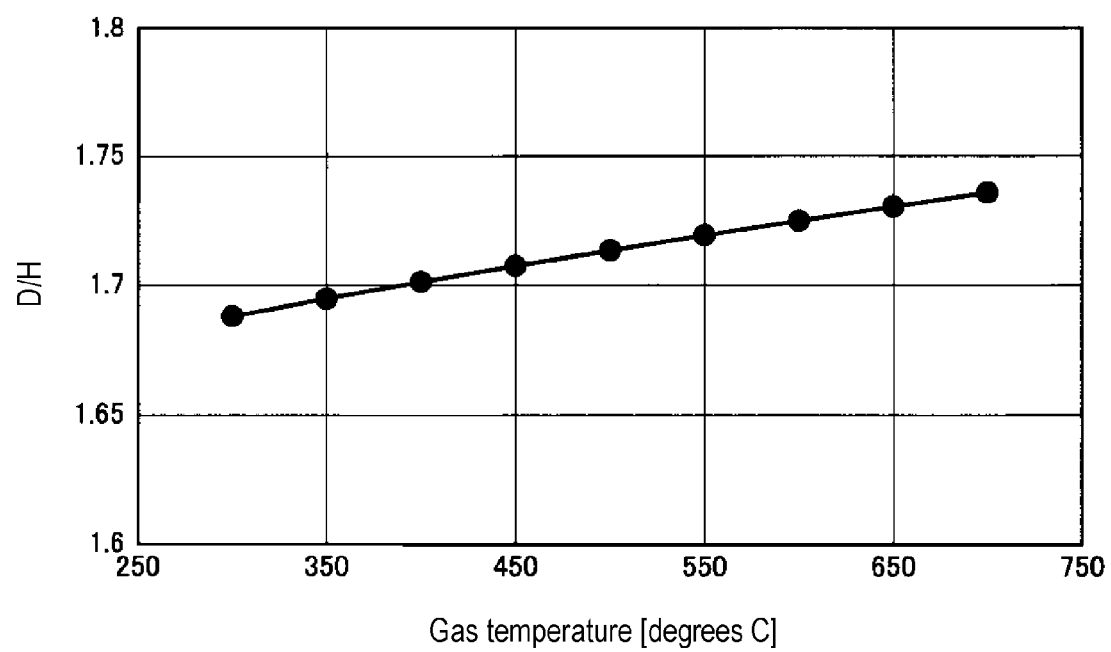
FIG. 11 is a diagram showing the simulation results of gas temperature dependence of D/H.

FIG. 11 is a diagram showing the simulation results of the gas temperature dependence of the D/H. In FIG. 11, the horizontal axis represents the gas temperature [degrees C.] during the plasma processing, and the vertical axis represents the D/H.

As shown in FIG. 11, it can be seen that the D/H is larger than 1 regardless of the gas temperature of 300 to 700 degrees C. during the plasma processing. From the results, it is considered that, by using the $D_2$ plasma when the gas temperature during the plasma processing is 300 to 700 degrees C., the amount of radicals contained in the plasma becomes larger than that when the $H_2$ plasma is used, which makes it possible to enhance the effect of removing impurities on the film surface. That is, it is considered that the use of the $D_2$ plasma makes it possible to form a thin film having a lower impurity concentration than that when the $H_2$ plasma is used.

Furthermore, as shown in FIG. 11, it can be seen that, when the gas temperature during the plasma processing is increased over a temperature range of 300 to 700 degrees C., the D/H increases. From the results, it is considered that the higher the gas temperature during the plasma processing, the higher the effect of removing impurities on the film surface by the radicals contained in the plasma.

Next, the D/H when the pressure in the plasma generation space is changed over a range of 300 to 2100 mTorr (40 to 100 Pa) was evaluated with respect to the simulation condition A.

Figure 12:
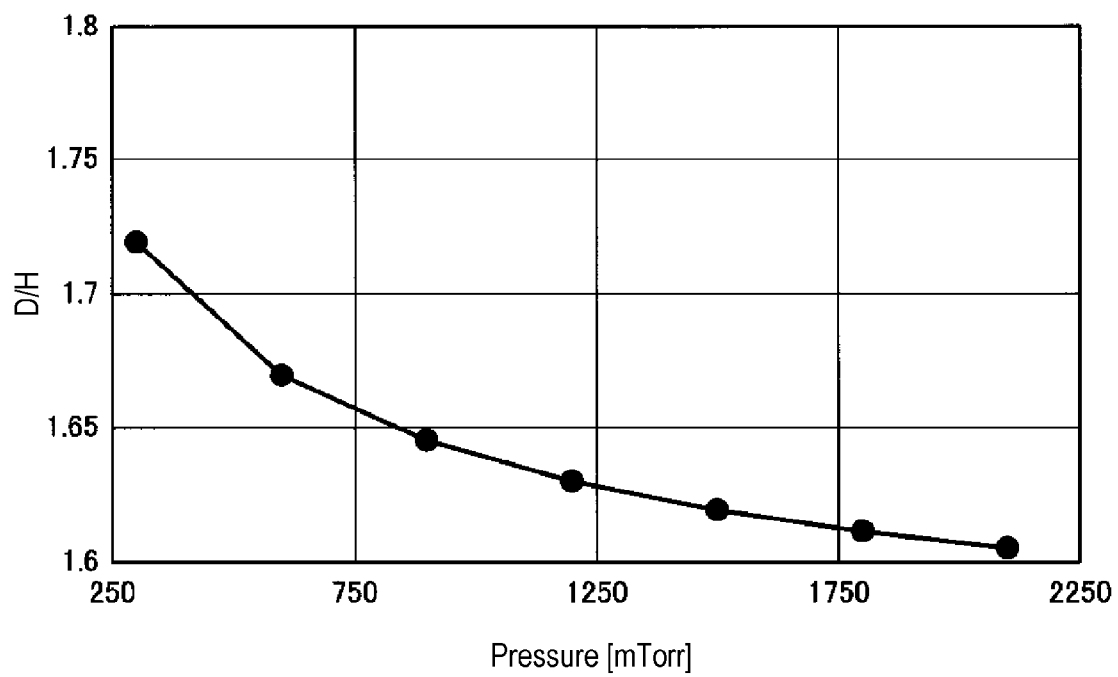
FIG. 12 is a diagram showing the simulation results of pressure dependence of D/H.

FIG. 12 is a diagram showing the simulation results of the pressure dependence of the D/H. In FIG. 12, the horizontal axis represents the pressure [mTorr], and the vertical axis represents the D/H.

As shown in FIG. 12, it can be seen that the D/H is larger than 1 regardless of the pressure in the plasma generation space of 300 to 2100 mTorr. From the results, it is considered that, by using the $D_2$ plasma when the pressure in the plasma generation space is 300 to 2100 mTorr, the amount of radicals contained in the plasma becomes larger than that when the $H_2$ plasma is used, which makes it possible to enhance the effect of removing impurities on the film surface. That is, it is considered that the use of the $D_2$ plasma makes it possible to form a thin film having a lower impurity concentration than that when the H$_2$ plasma is used.

Furthermore, as shown in FIG. 12, it can be seen that, when the pressure in the plasma generation space is reduced over a pressure range of 300 to 2100 mTorr, the D/H increases. From the results, it is considered that the lower the pressure in the plasma generation space, the higher the effect of removing impurities on the film surface by the radicals contained in the plasma.

Next, the D/H when the gas flow rate per plasma generation space is changed over a range of 33.9 to 67.8 sccm was evaluated with respect to the simulation condition A.

Figure 13:
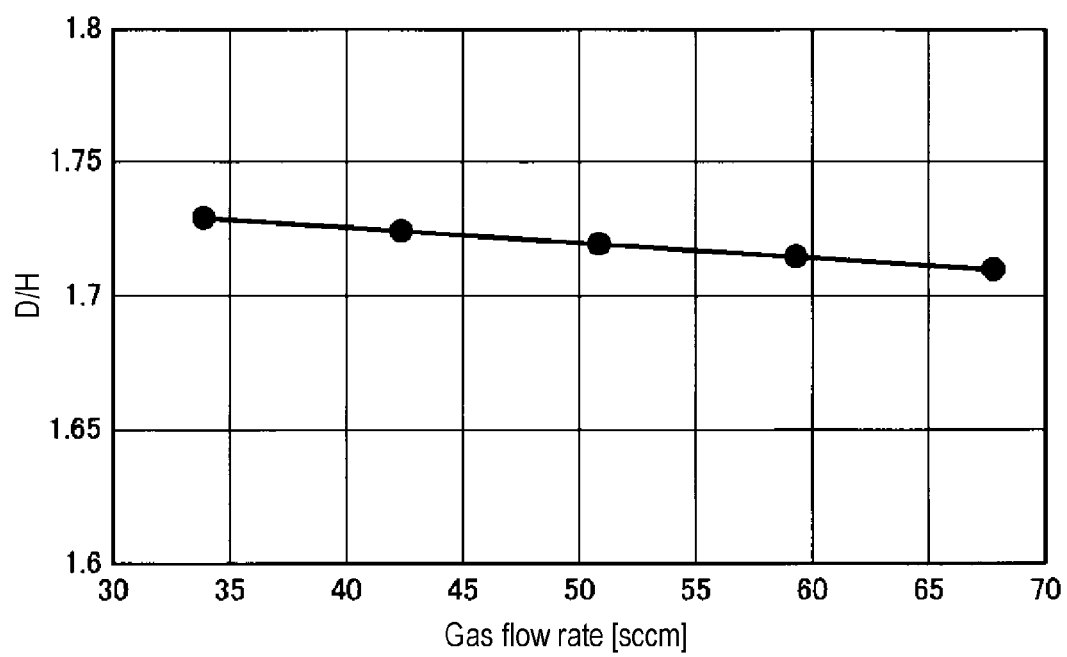
FIG. 13 is a diagram showing the simulation results of gas flow rate dependence of D/H.

FIG. 13 is a diagram showing the simulation results of the gas flow rate dependence of the D/H. In FIG. 13, the horizontal axis represents the gas flow rate per plasma generation space [sccm], and the vertical axis represents the D/H.

As shown in FIG. 13, it can be seen that the D/H is larger than 1 regardless of the gas flow rate per plasma generation space of 33.9 to 67.8 sccm. From the results, it is considered that, by using the D$_2$ plasma when the gas flow rate per plasma generation space is 33.9 to 67.8 sccm, the amount of radicals contained in the plasma becomes larger than that when the H$_2$ plasma is used, which makes it possible to enhance the effect of removing impurities on the film surface. That is, it is considered that the use of the D$_2$ plasma makes it possible to form a thin film having a lower impurity concentration than that when the H$_2$ plasma is used.

Furthermore, as shown in FIG. 13, it can be seen that, when the gas flow rate per plasma generation space is reduced over a flow rate range of 33.9 to 67.8 sccm, the D/H increases. From the results, it is considered that the lower the gas flow rate per plasma generation space, the higher the effect of removing impurities on the film surface by the radicals contained in the plasma.

According to the present disclosure in some embodiments, it is possible to form a thin film having a low impurity concentration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprising forming a thin film by executing a cycle a plurality of times, the cycle comprising:
   supplying a raw material gas to a substrate to adsorb the raw material gas to the substrate;
   desorbing impurities contained in the raw material gas adsorbed to the substrate by exposing the substrate to deuterium plasma; and
   supplying a reaction gas to the substrate to generate a reaction product of the raw material gas adsorbed to the substrate and the reaction gas,
   wherein the desorbing impurities is initiated after the supply of the raw material gas ends, and the supply of the reaction gas is initiated after the desorbing impurities ends,
   wherein the exposing the substrate to the deuterium plasma is performed without supplying the reaction gas to the substrate,
   wherein the desorbing impurities further includes exposing the substrate to hydrogen plasma without supplying the reaction gas to the substrate, where the exposing of the substrate to hydrogen plasma is performed before or after exposing the substrate to the deuterium plasma, and
   wherein the exposing the substrate to the hydrogen plasma is performed without exposing the substrate to the deuterium plasma, and the exposing the substrate to the deuterium plasma is performed without exposing the substrate to the hydrogen plasma.

2. The method of claim 1, wherein the exposing the substrate to the hydrogen plasma is performed before exposing the substrate to the deuterium plasma.

3. The method of claim 1, wherein the exposing the substrate to the hydrogen plasma is performed after exposing the substrate to the deuterium plasma.

4. The method of claim 1, wherein in the supplying a reaction gas, the raw material gas and the reaction gas are reacted by thermally decomposing the reaction gas or activating the reaction gas with plasma.

5. The method of claim 1, wherein the raw material gas is a silicon raw material gas, and the reaction gas is a nitriding gas.

6. The method of claim 5, wherein the silicon raw material gas is a silicon compound containing a halogen element.

7. The method of claim 5, wherein the silicon raw material gas includes a dichlorosilane gas.

8. The method of claim 6, wherein the halogen element is at least one of Cl, I and Br.

* * * * *